US010955467B2

(12) United States Patent
Abhishek et al.

(10) Patent No.: US 10,955,467 B2
(45) Date of Patent: Mar. 23, 2021

(54) EMBEDDED CONTINUITY TEST CIRCUIT (71) Applicant: NXP USA, INC., Austin, TX (US)

(72) Inventors: Kumar Abhishek, Austin, TX (US); Srikanth Jagannathan, Austin, TX (US); Hector Sanchez, Austin, TX (US)

(73) Assignee: NXP USA, INC., Austin, TX (US)

( * ) Notice: Subject to any disclaimer, the term of this patent is extended or adjusted under 35 U.S.C. 154(b) by 169 days.

(21) Appl. No.: 16/223,329

(22) Filed: Dec. 18, 2018

(65) Prior Publication Data

US 2020/0191862 A1 Jun. 18, 2020

(51) Int. Cl.
*G01R 31/28* (2006.01)

(52) U.S. Cl.
CPC .................. *G01R 31/2884* (2013.01)

(58) Field of Classification Search
CPC .............. G01R 31/28; G01R 31/2884; G01R 31/31707; G01R 11/25; G01R 31/3275; G01R 23/00; G01R 23/005; G01R 23/02
See application file for complete search history.

(56) References Cited

U.S. PATENT DOCUMENTS

| 6,005,407 | A | 12/1999 | Arabi et al. |
| 7,653,849 | B1 * | 1/2010 | Tabatabaei ....... G01R 31/31850 714/726 |
| 8,330,735 | B2 | 12/2012 | Lin et al. |

OTHER PUBLICATIONS

Arabi, K., "A New technique to the electrode and lead failures in implantable microstimulators and sensors", 18th Annual International Conference of the IEEE Amsterdam, Oct. 31-Nov. 3, 1996.
Arabi, K., "Testing Analog and Mixed-Signal Integrated Circuits Using Oscillation-Test Method", Short Papers, IEEE Transactions on Computer Aided Design of Integrated Circuits and Systems, vol. 16, No. 7, Jul. 1, 1997.
Arabi, K., "Parametric and Catastrophic Fault Coverage of Analog Circuits in Oscillation-Test Methodology", VLSI Test Symposium, Apr. 27-May 1, 1997.
Arabi, K., "Dynamic Digital Integrated Circuit Testing Using Oscillation-Test Method", Electronics Letters, IEEE Stevenage, vol. 34, No. 8, Apr. 16, 1998
Sunter, S., "Complete, Contactless 110 Testing—Reaching the Boundary in Minimizing Digital IC Testing Cost", ITC International Test Conference, IEEE 2002.

* cited by examiner

*Primary Examiner* — Son T Le (57) ABSTRACT

An embedded continuity test circuit is provided. An integrated circuit includes a bond pad and an oscillator circuit. The oscillator circuit is configured to generate an oscillator signal having a first frequency when the bond pad is coupled to a bond region of a package and a second frequency when the bond pad is not coupled to the bond region of the package.

20 Claims, 5 Drawing Sheets

EMBEDDED CONTINUITY TEST CIRCUIT

BACKGROUND

Field

This disclosure relates generally to integrated circuits, and more specifically, to integrated circuits with embedded continuity test circuitry.

Related Art

Today's electronic systems are reaching new levels of sophistication and complexity. Many of these systems are incorporated into safety critical applications such as those included in transportation vehicles, for example. Integrated circuits targeted for safety critical applications generally have redundant circuitry and are subjected to rigorous factory testing. However, some of these factory tests consume extended test time on expensive test equipment.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a continuity test circuit embedded in integrated circuit (IC) that can perform continuity testing without an expensive tester. The embedded continuity test circuit allows continuity testing in the field as well. In a test mode, the test circuit is configured to generate a test oscillator signal having a frequency based on an amount of capacitance coupled at a bond pad when the bond pad is bonded to a package or other external component. An unbonded or dummy bond pad is used to generate a fault reference signal frequency. Because of the distinct difference in capacitance between an unbonded bond pad and a bonded bond pad, the test circuit is configured to test continuity of a bond pad under test by comparing the generated test oscillator signal frequency with the fault reference signal frequency. When the generated test oscillator signal frequency is approximately the same as the fault reference signal frequency, a fault indication is provided.

Figure 1:
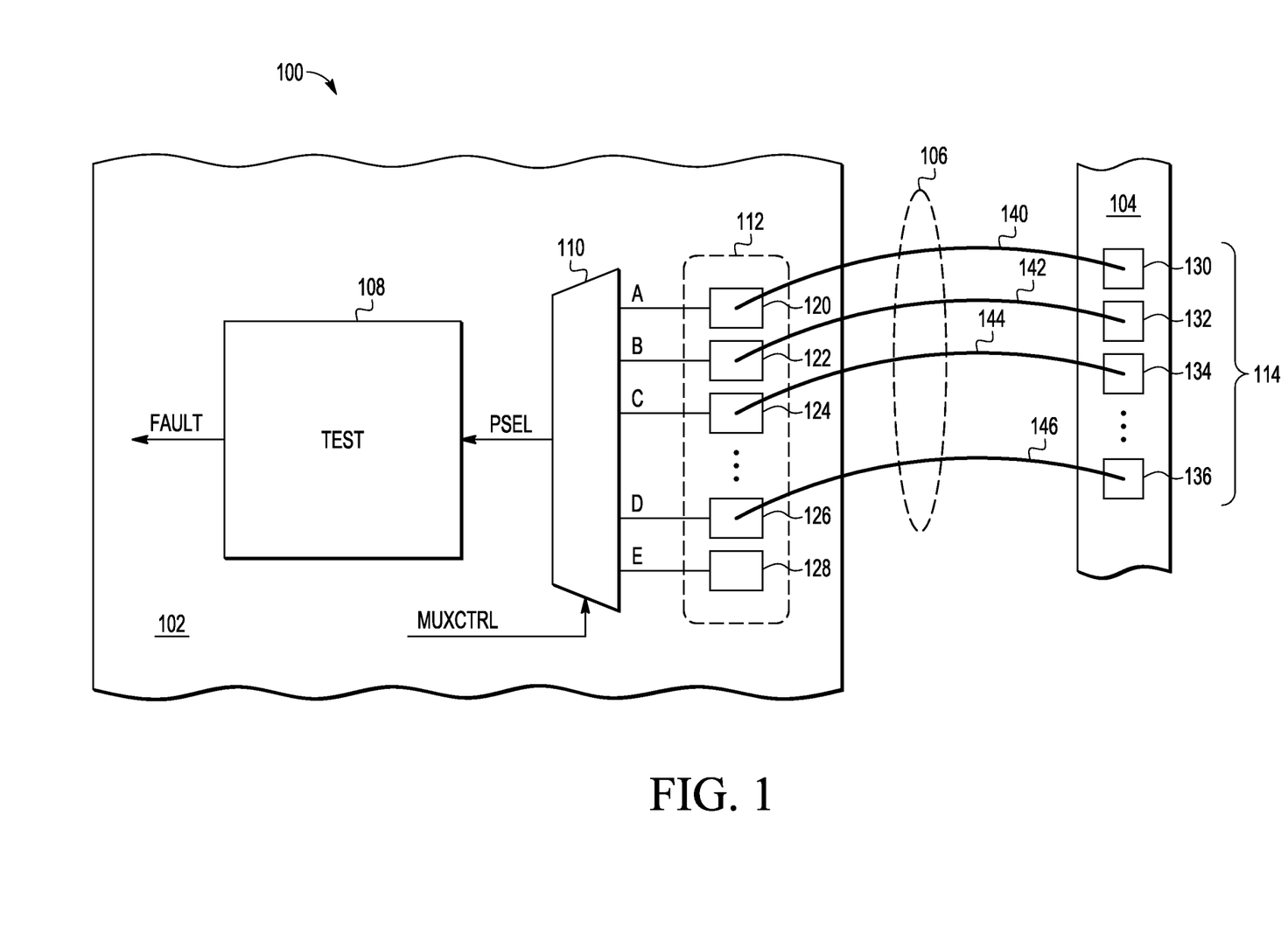
FIG. 1 illustrates, in simplified block diagram form, an example packaged integrated circuit in accordance with an embodiment.

FIG. 1 illustrates, in simplified block diagram form, an example packaged integrated circuit (IC) 100 in accordance with an embodiment. Packaged IC 100 includes an IC portion 102 coupled to a package portion 104 by way of bond wire group 106 (e.g., bond wires 140-146). The IC 102 includes a test circuit 108, a multiplexer 110, and a bond pad group 112 (e.g., bond pads 120-126 and dummy bond pad 128). The package 104 includes a bond region group 114 including bond regions 130-136. In this embodiment, bond pads 120-126 are coupled individually to the test circuit 108 by way of multiplexer 110. In some embodiments, each bond pad 120-126 may be coupled to respective test circuits by way of individual transmission gates, for example.

The bond pads 120-126 may be formed from any suitable conductive materials at a top surface of IC 102 and configured to provide electrical connection from IC 102 to package 104 by way of bond wires, solder bumps, and the like. The bond pads 120-126 may be part of general purpose input/output (GPIO) circuit structure which may be employed around the outer perimeter of IC 102. In this embodiment, suitable electrostatic discharge (ESD) circuitry is included in the bond pads 120-126 as illustrated.

The bond regions 130-136 may include locations on a package substrate, leadframe, metal trace, and the like suitable for wire bond attachment or other electrical connection (i.e., solder bump) between an external package lead (not shown) and bond pads 120-126. In some embodiments, IC 102 may be coupled to package 104 in a flip-chip configuration by way of solder bumps, for example.

Multiplexer 110 includes inputs labeled A through E coupled to respective pads 120-128 of pad group 112 and an output labeled PSEL. A control signal labeled MUXCTRL is used to select which pad of pad group 112 is coupled to the PSEL output node. In this embodiment, multiplexer 110 is characterized as an analog multiplexer where capacitance at the selected pad is coupled at the PSEL node. The MUXCTRL signal may be formed as a multi-bit control signal having multiple signal lines to select which pad is coupled to the PSEL node. For example, a 3-bit control signal may be formed with 3 signal lines which can be decoded to select one of (up to) eight pads. In this embodiment, multiplexer 110 is enabled and used during a continuity test while in a test mode.

Test circuit 108 includes an input coupled to the PSEL node and an output to provide a fault indication signal labeled FAULT. The test circuit 108 includes circuitry configured to generate an oscillator clock signal having a frequency based on the net amount of capacitance coupled at the PSEL node. In turn, the oscillator clock signal frequency is used to determine if a bond wire or other connection (i.e., to a package or other external component) is intact at a pad being tested. The test circuit 108 is also configured to determine a reference signal having a reference frequency when generating the oscillator clock signal with the dummy bond pad 128 coupled to the PSEL node. Because the dummy bond pad 128 is not coupled to a bond region of package 104, the determined reference signal frequency can be used to generate a fault frequency range. For example, the fault frequency range may be set at approximately 80% of the determined reference signal frequency and greater.

As depicted in the embodiment of FIG. 1, dummy bond pad 128 is essentially similar to each of bond pads 120-126, but dummy bond 128 pad is unbonded (i.e., not coupled to a package or other external component by way of bond wire, solder bump, etc.). The dummy bond pad 128 has a capacitance value of approximately 1 picofarad (pf) in a modern process technology such as used in IC 102. Likewise, each of bond pads 120-126 has a capacitance value of approximately 1 pf when unbonded. In other embodiments, bond pads 120-126 may have other capacitance values. Because, each of bond pads 120-126 has a similar capacitance to that of dummy bond pad 128, dummy bond pad 128 can be used as a reference pad for generating the fault reference oscillator clock signal having a fault reference frequency.

Each of bond regions 130-136 has a capacitance value of approximately 1 pf in a modern packaging technology such as used in package 104. In other embodiments, bond regions 130-136 may have other capacitance values. When bond regions 130-136 are coupled to bond pads 120-126 by way of bond wires 140-146, a net capacitance value of approximately 2 pf results at each of bond pads 120-126. Because of the distinct difference in capacitance between an unbonded pad (e.g., dummy bond pad) and a bonded pad (e.g., bond pads 120-126 coupled to a package or other component by way of bond wire, solder bump, etc.), a continuity test comparing the fault reference signal frequency with oscillator clock signal frequencies measured at each of bond pads 120-126 provides a fault indication when a measure signal frequency is within the fault frequency range.

In operation, multiplexer 110 is configured to couple the dummy bond pad 128 at the E input to the PSEL output node for determining a fault reference frequency (i.e., number of pulses in a predetermined timeframe). After determining the fault reference frequency, each bond pad 120-126 may be tested individually (i.e., compared with fault reference frequency) by using multiplexer 110 to select one bond pad after another to be coupled to the PSEL output node. When coupled to the PSEL output node, an oscillator clock signal is generated having a frequency based on capacitance coupled at the selected bond pad. Because the capacitance coupled at the PSEL node is significantly higher when bond pads 120-126 are bonded, the oscillator clock signal generated will have a frequency about much lower (i.e., ~50%) than the fault reference signal frequency. However, when the generated oscillator clock frequency is within the fault frequency range, a fault indication is provided at the FAULT output.

Figure 2:
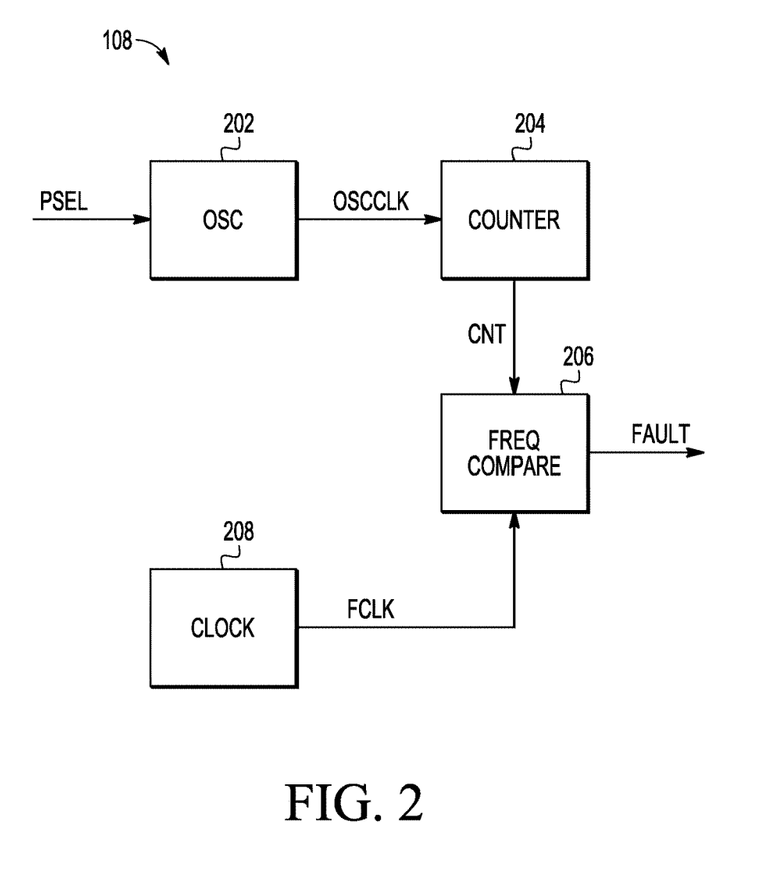
FIG. 2 illustrates, in simplified block diagram form, a more detailed example test circuit of FIG. 1 in accordance with an embodiment.

FIG. 2 illustrates, in simplified block diagram form, a more detailed example of test circuit 108 of FIG. 1 in accordance with an embodiment. Test circuit 108 includes an oscillator circuit 202 labeled OSC, a counter circuit 204 labeled COUNTER, a frequency compare circuit 206 labeled FREQ COMPARE, and a clock circuit 208 labeled CLOCK.

The oscillator circuit 202 includes an input coupled to the PSEL node and an output for providing an oscillator clock signal OSCCLK having a frequency based on the capacitance coupled at the PSEL node. The oscillator circuit 202 may be any suitable oscillator (e.g., RC oscillator, ring oscillator) capable of providing an output signal having a frequency based on the capacitance coupled at the PSEL node. For example, when bond pad 120 is coupled to bond region 130 by way of bond wire 140, the oscillator circuit 202 generates the OSCCLK signal having a frequency based on the capacitance coupled at the PSEL node (e.g., capacitance of bond pad 120 plus capacitance at bond region 130).

The counter circuit 204 includes an input coupled to receive the OSCCLK signal and an output to provide a count value CNT signal indicative of the frequency of the OSCCLK signal. For example, the counter circuit 204 is configured to count a number of OSCCLK pulses in a predetermined time period. The number of pulses counted is provided as a CNT signal at the output. The CNT signal may be used to determine an absolute frequency or a relative frequency. For example, if during a test, 35 clock pulses of OSCCLK are counted by counter circuit 204 in a 1 millisecond time period, the absolute frequency of OSCCLK would be 35 MHz which could be compared with a reference signal's frequency (e.g., 70 MHz). On the other hand, comparing numbers of pulses counted over a similar time period can be used to determine a relative frequency difference. For example, if during a second test, 25 clock pulses of OSCCLK are counted by counter circuit 204 in one time period and during a third test, 50 clock pulses of OSCCLK are counted by counter circuit 204 in a similar time period, the OSCCLK frequency during the second test would be approximately half of the OSCCLK frequency during the third test.

The frequency compare circuit 206 includes a first input coupled to receive the CNT signal, a second input coupled to receive a high-speed clock signal from clock circuit 208, and an output for providing a fault indication signal labeled FAULT. The frequency compare circuit 206 is configured to store a reference frequency (e.g., reference pulse count) of OSCCLK when oscillator circuit 202 is coupled to dummy bond pad 128, for example. The reference frequency may serve as a baseline frequency corresponding to an unbonded bond pad. The reference frequency may be programmed into the frequency compare circuit 206 during manufacture (e.g., programmed into ROM) or during factory testing (programmed into non-volatile memory) of IC 102 non-volatile memory. The reference frequency may be updated or generated on-the-fly (e.g., during a test mode operation) and stored in the frequency compare circuit 206. The frequency compare circuit 206 includes circuitry to compare the received the CNT signal with the reference frequency to determine if a continuity error (e.g., broken bond wire) exists. For example, if a bond pad is coupled at the PSEL node during a continuity test, and a resulting OSCCLK frequency is within a fault frequency range based on the reference frequency, then a fault indication signal FAULT is generated. The FAULT signal indicates that an open circuit exists between the bond pad and respective bond region of package 104 due to a broken bond wire, lifted wire bond, and the like.

The clock circuit 208 includes and output for providing a clock signal FOLK to the frequency compare circuit 206. The clock circuit 208 includes circuitry for generating the FOLK signal having a frequency at least twice (e.g., 2×) possible frequencies of the OSCCLK signal. The FOLK may be generated based on a PLL clock of the clock circuit 208 or may be generated based on a clock provided outside of the clock circuit 208.

Figure 3:
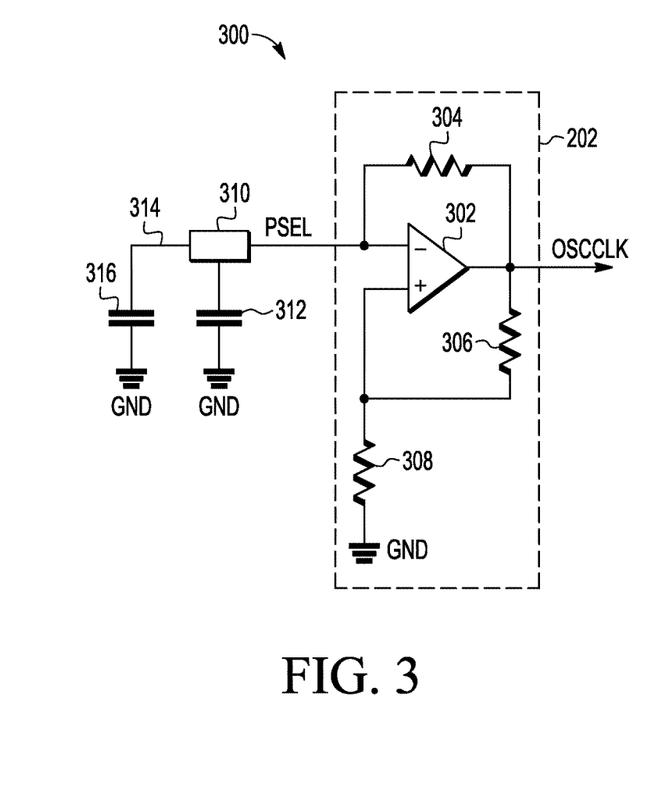
FIG. 3 illustrates, in simplified schematic diagram form, an example R-C oscillator circuit in accordance with an embodiment.

FIG. 3 illustrates, in simplified schematic diagram form, an example RC oscillator circuit 300 in accordance with an embodiment. In this embodiment, RC oscillator circuit 300 includes an implementation example of the oscillator circuit 202 of FIG. 2 having an input coupled to a bond pad 310 at node PSEL during a test mode and an output for providing a corresponding OSCCLK signal. The example implementation of oscillator circuit 202 includes an operational amplifier (op amp) 302 and tuning resistors 304-308 coupled to bond pad 310 including corresponding capacitances indicated by capacitors 312 and 316. An inverting input (−) of op amp 302 is coupled to bond pad 310 and a first terminal of resistor 304 at the PSEL node. A non-inverting input (+) of op amp 302 is coupled to a first terminal of resistor 306 and a first terminal of resistor 308. An output of op amp 302 is coupled to second terminals of resistor 304 and 306 at output node OSCCLK, and a second terminal of resistor 308 is coupled to a first voltage supply terminal labeled GND. In this embodiment, the GND supply is configured to supply a ground voltage or 0 volts. For illustration purposes, capacitances at bond pad 310 are shown by capacitors 312 and 316. Capacitor 312 is representative of the capacitance of bond pad 310 (e.g., bond pads 120-126) alone and capacitor 316 is representative of package capacitance at a bond region (e.g., bond regions 130-136 of package 104). A first terminal of capacitor 312 is coupled at bond pad 310 and a second terminal of capacitor 312 is coupled at the GND supply terminal. A first terminal of capacitor 316 is coupled to bond pad 310 by way of conductor 314 representative of a bond wire (e.g., bond wires 140-146) and a second terminal of capacitor 316 is coupled at the GND supply terminal. In this arrangement, the net capacitance of capacitors 312 and 316 is coupled at the PSEL node.

Figure 4:
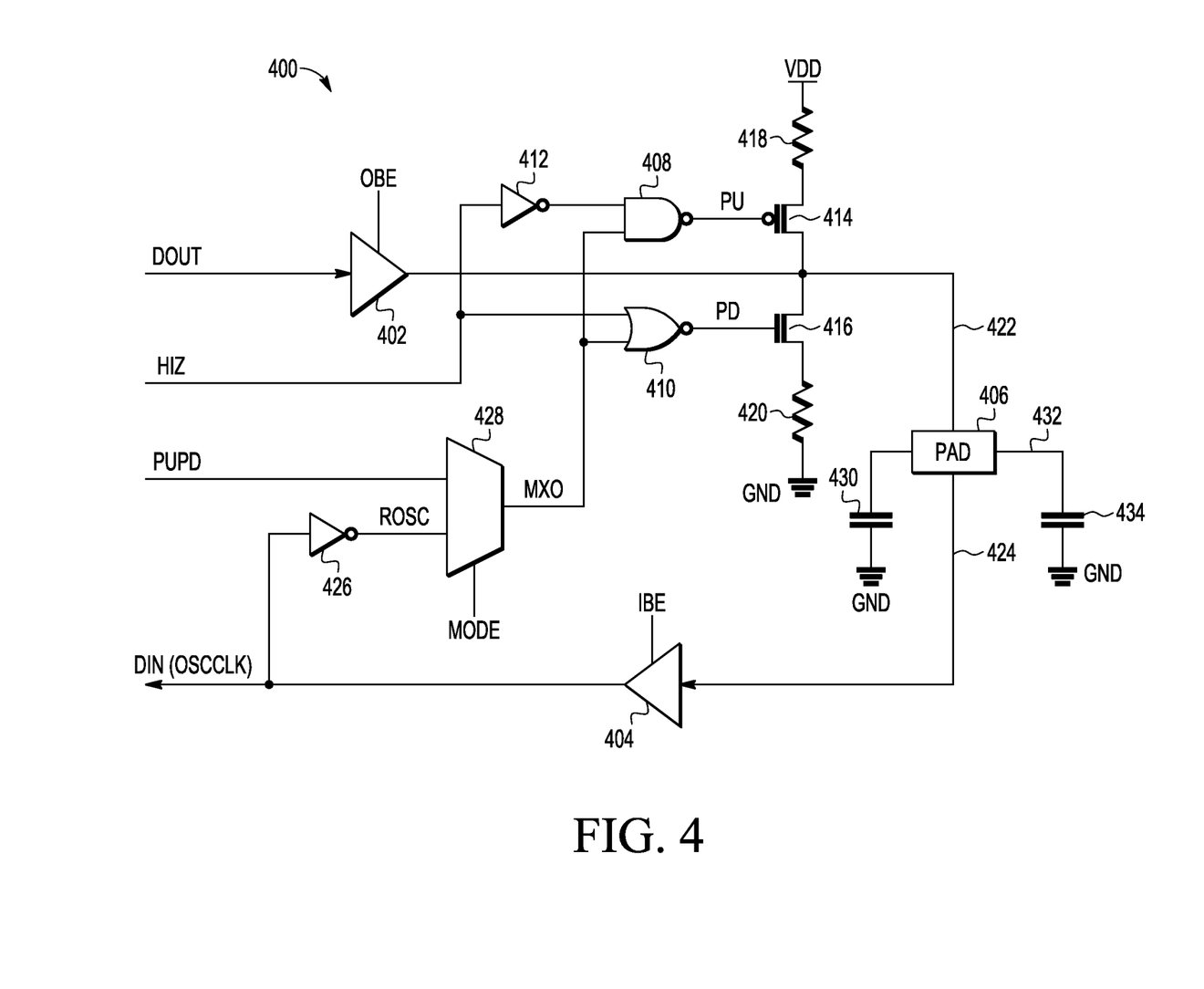
FIG. 4 illustrates, in simplified schematic diagram form, an example ring oscillator circuit in accordance with an embodiment.

FIG. 4 illustrates, in simplified schematic diagram form, an example GPIO circuit 400 having a ring oscillator circuit in accordance with an embodiment. In this embodiment, an example ring oscillator circuit (e.g., oscillator circuit 202) is incorporated in the GPIO circuit 400 having a data out signal input labeled DOUT, a data in signal output labeled DIN (e.g., serves as OSCCLK in a test mode), output buffer enable signal input labeled OBE, input buffer enable signal input labeled IBE, pull-up/pull-down resistor control signal inputs labeled HIZ and PUPD, and mode select input labeled MODE. The GPIO circuit 400 includes an output buffer circuit 402, and input buffer circuit 404, bond pad 406, pull-up and pull-down resistor circuitry (e.g., NAND gate 408, NOR gate 410, inverters 412 and 426, transistors 414-416, resistors 418-420), and multiplexer 428.

The output buffer circuit 402 includes a first input coupled to receive the DOUT signal, a second input coupled to receive the OBE signal, and an output coupled to bond pad 406 by way of output path conductor 422. When enabled, output buffer circuit 402 is configured to drive an output signal of IC 102 by way of bond pad 406. The input buffer circuit 404 includes a first input coupled to bond pad 406 by way of input path conductor 424, a second input coupled to receive the IBE signal, and an output coupled to provide the DIN signal in a normal mode and OSCCLK signal in a test mode. When enabled, the input buffer circuit 404 is configured to transfer a received input signal at bond pad 406 to internal circuitry of IC 102. The input buffer circuit 404 is configured to include hysteresis circuitry (e.g., a Schmitt trigger circuit). The output of the input buffer circuit 404 is coupled to an input of inverter 426 and an output of inverter 426 is coupled to a first input of multiplexer 428 at node labeled ROSC. A second input of multiplexer 428 is coupled to receive the PUPD control signal and a select input of multiplexer is coupled to receive the MODE signal. An output of multiplexer 428 is coupled to first inputs of NAND and NOR gates 408 and 410 at node labeled MXO. A second input of NOR gate 410 and an input of inverter 412 are coupled to receive the HIZ control signal. A second input of NAND gate 408 is coupled to an output of inverter 412 and an output of NAND gate 408 is coupled to a control electrode of P-channel transistor 414 at node labeled PU. A first current electrode of transistor 414 is coupled to a first terminal of pull-up resistor 418 and a second terminal of resistor 418 is coupled to a second voltage supply terminal labeled VDD. In this embodiment, the VDD supply is configured to supply a nominal or normal operating voltage. An output of NOR gate 410 is coupled to a control electrode of N-channel transistor 416 at node labeled PD. A first current electrode of transistor 416 is coupled to a first terminal of pull-down resistor 420 and a second terminal of resistor 420 is coupled to the GND supply terminal. Second current electrodes of transistors 414 and 416 are coupled at conductor 422. In this embodiment, resistors 418 and 420 may have resistance values in a range of 10 k to 100 k ohms. In other embodiments, resistors 418 and 420 may have other resistance values.

For illustration purposes, capacitances at bond pad 406 are shown by capacitors 430 and 434. Capacitor 430 is representative of the capacitance of bond pad 406 (e.g., bond pads 120-126) alone and capacitor 434 is representative of package capacitance at a bond region (e.g., bond regions 130-136 of package 104 and parasitic capacitance). A first terminal of capacitor 430 is coupled at bond pad 406 and a second terminal of capacitor 430 is coupled at the GND supply terminal. A first terminal of capacitor 434 is coupled to bond pad 406 by way of conductor 432 representative of a bond wire (e.g., bond wires 140-146) and a second terminal of capacitor 434 is coupled at the GND supply terminal. In this arrangement, the net capacitance of capacitors 430 and 434 is coupled at the bond pad 406 which corresponds to the PSEL node of oscillator 202, for example.

In a test mode, a continuity test may be performed while GPIO circuit 400 is configured as a ring oscillator utilizing the capacitance coupled at bond pad 406. When configured as a ring oscillator, output buffer 402 is disabled, input buffer 404 is enabled, multiplexer 428 is configured to couple ROSC input to MXO output, and the HIZ control signal is de-asserted (e.g., logic low). In this configuration, an input path (e.g., conductor 424 having one end coupled at bond pad 406) is coupled to an output path (e.g., conductor 422 having one end coupled at bond pad 406) in a ring having an odd number of inverting stages (e.g., inverter 426 stage, NAND/NOR stage, and inverter stage formed by transistors 414-416 and resistors 418-420). When configured as a ring oscillator, conductors 422 and 424 together correspond to the PSEL node and the DIN signal corresponds to the OSCCLK output as depicted in oscillator circuit 202 of FIG. 2. Because an odd number of inverting stages are formed between the input path and output path, the ring oscillator oscillates and generates an OSCCLK signal at the output of input buffer circuit 404. The OSCCLK signal has a frequency dependent upon the net amount of capacitance coupled at bond pad 406. Accordingly, the continuity test compares the OSCCLK frequency with a reference frequency determined when a bond pad is unbonded. If the OSCCLK frequency is much lower (e.g., 50% of the reference frequency) than the reference frequency, then the bond pad 406 is determined to be properly connected to a package bonding region. However, if the OSCCLK frequency is approximately the same as the reference frequency, then the bond pad 406 is determined to be not connected to a package bonding region and thus, generating a fault indication.

Figure 5:
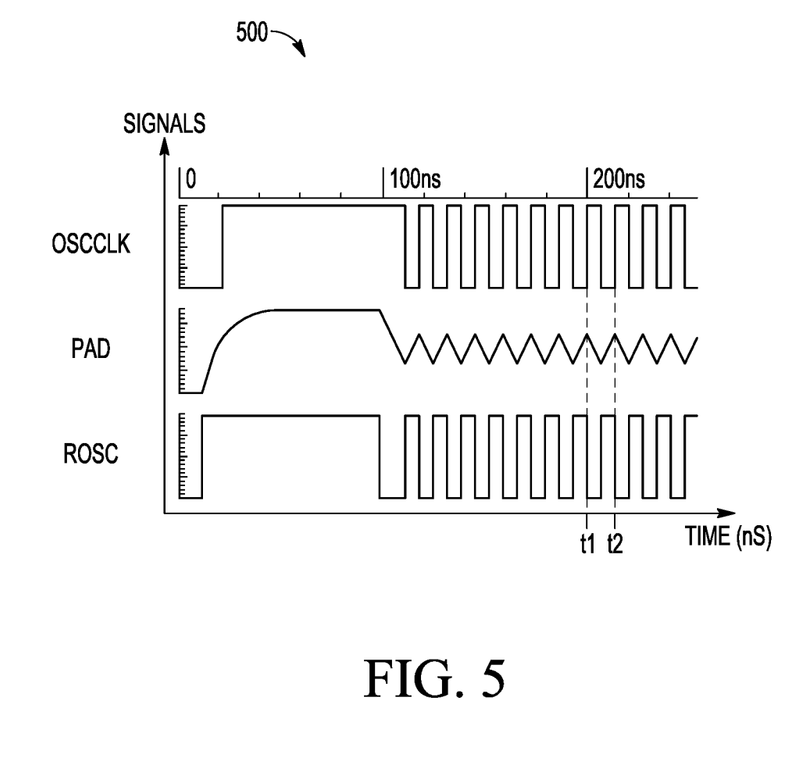
FIG. 5 illustrates, in plot diagram form, example simulation results of the ring oscillator circuit of FIG. 4 when bond pad is unbonded in accordance with an embodiment.

FIG. 5 illustrates, in plot diagram form, example simulation result of the ring oscillator circuit configuration of FIG. 4 in accordance with an embodiment. The plot diagram 500 includes voltage waveforms of the OSCCLK, PAD, and ROSC signals when bond pad 406 is unbonded (i.e., not coupled to a package) versus time shown in nanoseconds (ns) on the X-axis. At about the 100 ns time in the simulation, the ring oscillator is enabled allowing the PAD signal (i.e., taken at bond pad 406) to oscillate based on the net amount of capacitance coupled at bond pad 406. The resulting OSCCLK and ROSC signal waveforms show full rail-to-rail signals corresponding to the PAD signal. The absolute frequency of the OSCCLK signal is determined by taking the inverse of the OSCCLK period from time marker t1 to time marker t2. In this example, the OSCCLK signal has a period of approximately 13.5 ns and a frequency of approximately 74 MHz. A relative frequency is determined by counting a number of OSCCLK signal pulses over a predetermined timeframe. For example, 8 pulses of the OSCCLK signal may be counted over the timeframe from 110 ns to 220 ns. By counting signal pulses, relative frequencies of signals can be compared without complex mathematical circuitry as required when determining and comparing absolute frequencies of signals. Because bond pad 406 is unbonded in these examples, the absolute frequency (i.e., ~74 MHz) and relative frequency (i.e., 8 pulses over 110 ns) may be used as a fault reference frequency or count. The fault reference frequency or count may be adjusted by a suitable margin to form a fault reference frequency range or fault count range. For example, the fault frequency range or count may be set at approximately 50% of the fault reference frequency or fault count and greater (i.e., ~37 MHz and greater, 4 pulses and greater over 110 ns). In some embodiments, the fault frequency range or count may be set at approximately 80% of the fault reference frequency or fault count and greater (i.e., ~59 MHz and greater, 6 pulses and greater over 110 ns).

Figure 6:
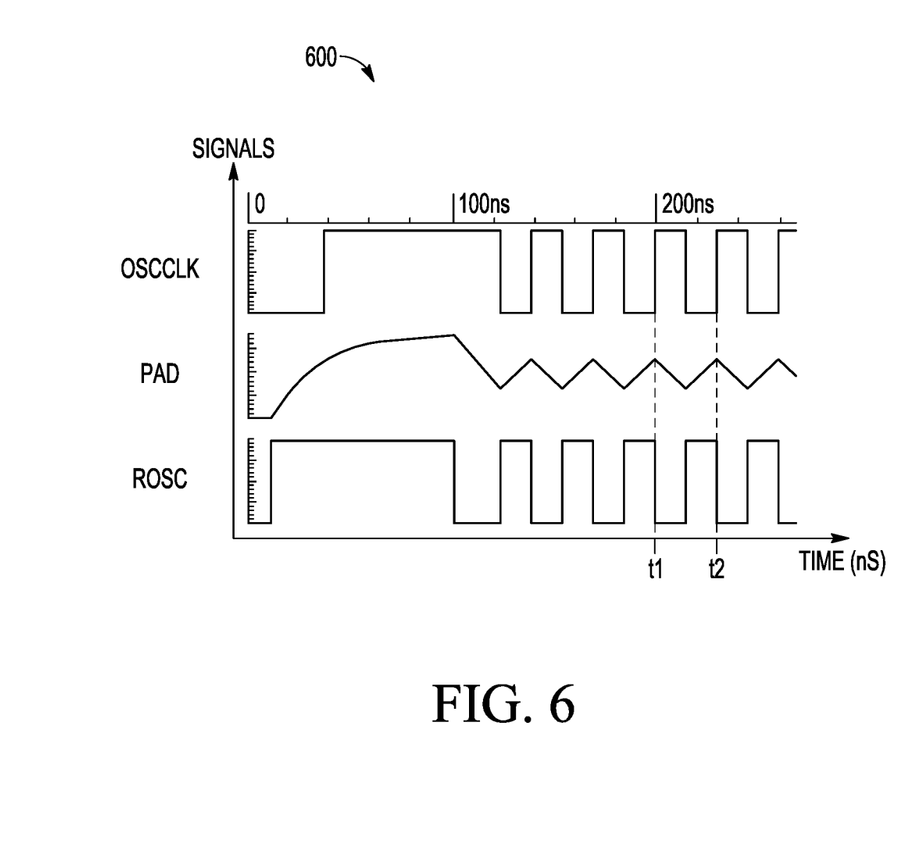
FIG. 6 illustrates, in plot diagram form, example simulation results of the ring oscillator circuit of FIG. 4 when bond pad is bonded in accordance with an embodiment.

FIG. 6 illustrates, in plot diagram form, example simulation result of the ring oscillator circuit configuration of FIG. 4 when bond pad 406 is bonded in accordance with an embodiment. The plot diagram 600 includes voltage waveforms of the OSCCLK, PAD, and ROSC signals when bond pad 406 is bonded (i.e., coupled to a package) versus time shown in nanoseconds (ns) on the X-axis. At about the 100 ns time in the simulation, the ring oscillator is enabled allowing the PAD signal (i.e., taken at bond pad 406) to oscillate based on the net amount of capacitance coupled at bond pad 406. The resulting OSCCLK and ROSC signal waveforms show full rail-to-rail signals corresponding to the PAD signal. The absolute frequency of the OSCCLK signal is determined by taking the inverse of the OSCCLK period from time marker t1 to time marker t2. In this example, the OSCCLK signal has a period of approximately 30 ns and a frequency of approximately 33 MHz. A relative frequency is determined by counting a number of OSCCLK signal pulses over the predetermined 110 ns timeframe. For example, 3 pulses of the OSCCLK signal may be counted over the timeframe from 110 ns to 220 ns. Because bond pad 406 is bonded in these examples, the absolute frequency (i.e., ~33 MHz) and relative frequency (i.e., 3 pulses over 110 ns) are much lower due to the addition of package capacitance coupled at bond pad 406. Here, the absolute frequency (i.e., ~33 MHz) and relative frequency (i.e., 3 pulses over 110 ns) do not fall in the fault frequency range (i.e., ~37 MHz and greater) or count (i.e., 4 pulses and greater over 110 ns timeframe) when set at approximately 50% of the fault reference frequency or fault count and greater.

In one embodiment, there is provided, an integrated circuit including a first bond pad; and an oscillator circuit configured to generate an oscillator signal having a first frequency when the first bond pad is coupled to a bond region of a package and a second frequency when the first bond pad is not coupled to the bond region of the package. The integrated circuit may further include a counter circuit coupled to receive the oscillator signal, the counter circuit configured to count pulses of the oscillator signal. The integrated circuit may further include a compare circuit configured to generate a fault indication when the oscillator signal has a frequency within a fault frequency range, the fault frequency range set at approximately 80% of the second frequency and greater. The integrated circuit may further include a dummy bond pad, the first bond pad and the dummy bond pad selectively coupled to the oscillator circuit by way of a multiplexer circuit. The oscillator circuit may generate the oscillator signal having the second frequency when coupled to the dummy bond pad. The oscillator circuit may be characterized as a ring oscillator including an input path having a first end coupled at the first bond pad and an output path having a first end coupled at the first bond pad, the input path coupled to the output path by way of an odd number of inverting stages. The oscillator circuit may be characterized as an RC oscillator configured to generate the oscillator signal having the first frequency and the second frequency by utilizing the capacitance coupled at the first bond pad. The first bond pad may be coupled to the bond region of the package by way of a bond wire. The oscillator circuit may be configured to generate the oscillator signal during a test mode.

In another embodiment, there is provided, an integrated circuit including a first bond pad; an oscillator circuit coupled at the first bond pad, the oscillator circuit configured to generate an oscillator signal having a first frequency based on a capacitance coupled at the first bond pad; and a compare circuit configured to generate a fault indication when the first frequency is within a fault frequency range. The fault frequency range may be based on the generated oscillator signal having a second frequency, the second frequency based on the capacitance when the first bond pad is not coupled to a bond region of a package. The fault frequency range may be approximately 80% of the second frequency and greater. The first frequency may be based on the capacitance when the first bond pad is coupled to the bond region of the package, the first frequency being less than the second frequency. The oscillator circuit may be characterized as a ring oscillator including an input path having a first end coupled at the first bond pad and an output path having a first end coupled at the first bond pad, the input path coupled to the output path by way of an odd number of inverting stages. The oscillator circuit may be characterized as an RC oscillator configured to generate the oscillator signal having the first frequency by utilizing the capacitance coupled at the first bond pad. The oscillator circuit may be configured to generate the oscillator signal during a continuity test while in a test mode.

In yet another embodiment, there is provided, an integrated circuit including a plurality of bond pads; a multiplexer circuit having an output and a plurality of inputs, each input coupled to a respective bond pad of the plurality of bond pads; an oscillator circuit coupled to the output of the multiplexer, the oscillator circuit configured to generate an oscillator signal having a first frequency based on a capacitance coupled at the output of the multiplexer; and a compare circuit configured to generate a fault indication when the first frequency is within a fault frequency range. The multiplexer may be configured to electrically couple a first bond pad of the plurality to the multiplexer output based on a control signal during a test mode. The multiplexer may be further configured to electrically couple a dummy bond pad to the multiplexer output based on the control signal, the oscillator circuit configured to generate the oscillator signal having a second frequency, the fault frequency range set at approximately 80% of the second frequency and greater. The oscillator circuit may be characterized as an RC oscillator configured to generate the oscillator signal by utilizing the capacitance coupled at the output of the multiplexer.

By now it should be appreciated that there has been provided, a continuity test circuit embedded in integrated circuit (IC) that can perform continuity testing without an expensive tester. The embedded continuity test circuit allows continuity testing in the field as well. In a test mode, the test circuit is configured to generate a test oscillator signal having a frequency based on an amount of capacitance coupled at a bond pad when the bond pad is bonded to a package or other external component. An unbonded or dummy bond pad is used to generate a fault reference signal frequency. Because of the distinct difference in capacitance between an unbonded bond pad and a bonded bond pad, the test circuit is configured to test continuity of a bond pad under test by comparing the generated test oscillator signal frequency with the fault reference signal frequency. When the generated test oscillator signal frequency is approximately the same as the fault reference signal frequency, a fault indication is provided.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged integrated circuit including a package portion and an integrated circuit portion, the packaged integrated circuit comprising:
    a first bond pad of the integrated circuit portion;
    an oscillator circuit configured to generate an oscillator signal having a first frequency when the first bond pad is coupled to a bond region of the package portion and a second frequency when the first bond pad is not coupled to the bond region of the package; and
    a dummy bond pad, the first bond pad and the dummy bond pad selectively coupled to the oscillator circuit by way of a multiplexer circuit.

2. The packaged integrated circuit of claim 1, further comprising a counter circuit coupled to receive the oscillator signal, the counter circuit configured to count pulses of the oscillator signal.

3. The packaged integrated circuit of claim 1, further comprising a compare circuit configured to generate a fault indication when the oscillator signal has a frequency within a fault frequency range, the fault frequency range set at approximately 80% of the second frequency and greater.

4. The packaged integrated circuit of claim 1, wherein the oscillator circuit generates the oscillator signal having the second frequency when coupled to the dummy bond pad.

5. The packaged integrated circuit of claim 1, wherein the oscillator circuit is characterized as a ring oscillator including an input path having a first end coupled at the first bond pad and an output path having a first end coupled at the first bond pad, the input path coupled to the output path by way of an odd number of inverting stages.

6. The packaged integrated circuit of claim 1, wherein the oscillator circuit is characterized as an RC oscillator configured to generate the oscillator signal having the first frequency and the second frequency by utilizing the capacitance coupled at the first bond pad.

7. The packaged integrated circuit of claim 1, wherein the first bond pad is coupled to the bond region of the package by way of a bond wire.

8. The packaged integrated circuit of claim 1, wherein the oscillator circuit is configured to generate the oscillator signal during a test mode.

9. A packaged integrated circuit including a package portion and an integrated circuit portion, the packaged integrated circuit comprising:
    a first bond pad of the integrated circuit portion;
    an oscillator circuit coupled at the first bond pad, the oscillator circuit configured to generate an oscillator signal having a first frequency based on a capacitance coupled at the first bond pad; and
    a compare circuit configured to generate a fault indication when the first frequency is within a fault frequency range;
    wherein the oscillator circuit is characterized as a ring oscillator including an input path having a first end coupled at the first bond pad and an output path having a first end coupled at the first bond pad, the input path coupled to the output path by way of an odd number of inverting stages.

10. The packaged integrated circuit of claim 9, wherein the fault frequency range is based on the generated oscillator signal having a second frequency, the second frequency based on the capacitance when the first bond pad is not coupled to a bond region of a package.

11. The packaged integrated circuit of claim 10, wherein the fault frequency range is approximately 80% of the second frequency and greater.

12. The packaged integrated circuit of claim 10, wherein the first frequency is based on the capacitance when the first bond pad is coupled to the bond region of the package, the first frequency being less than the second frequency.

13. The packaged integrated circuit of claim 9, wherein the oscillator circuit is characterized as an RC oscillator configured to generate the oscillator signal having the first frequency by utilizing the capacitance coupled at the first bond pad.

14. The packaged integrated circuit of claim 9, wherein the oscillator circuit is configured to generate the oscillator signal during a continuity test while in a test mode.

15. A packaged integrated circuit including a package portion and an integrated circuit portion, the packaged integrated circuit comprising:
  a plurality of bond pads of the integrated circuit portion;
  a multiplexer circuit having an output and a plurality of inputs, each input coupled to a respective bond pad of the plurality of bond pads, the multiplexer configured to electrically couple a first bond pad of the plurality to the multiplexer output based on a control signal during a test mode;
  an oscillator circuit coupled to the output of the multiplexer, the oscillator circuit configured to generate an oscillator signal having a first frequency based on a capacitance coupled at the output of the multiplexer; and
  a compare circuit configured to generate a fault indication when the first frequency is within a fault frequency range;
  wherein the multiplexer is further configured to electrically couple a dummy bond pad to the multiplexer output based on the control signal, the oscillator circuit configured to generate the oscillator signal having a second frequency, the fault frequency range set at approximately 80% of the second frequency and greater.

16. The packaged integrated circuit of claim 15, wherein the oscillator circuit is characterized as an RC oscillator configured to generate the oscillator signal by utilizing the capacitance coupled at the output of the multiplexer.

17. A packaged integrated circuit including a package portion and an integrated circuit portion, the packaged integrated circuit comprising:
  a first bond pad of the integrated circuit portion; and
  an oscillator circuit of the integrated circuit portion configured to generate an oscillator signal having a first frequency when the first bond pad is coupled to a bond region of the package portion and a second frequency when the first bond pad is not coupled to the bond region of the package portion;
  wherein the oscillator circuit is characterized as a ring oscillator including an input path having a first end coupled at the first bond pad and an output path having a first end coupled at the first bond pad, the input path coupled to the output path by way of an odd number of inverting stages.

18. The packaged integrated circuit of claim 17, further comprising a counter circuit coupled to receive the oscillator signal, the counter circuit configured to count pulses of the oscillator signal.

19. The packaged integrated circuit of claim 17, further comprising a compare circuit configured to generate a fault indication when the oscillator signal has a frequency within a fault frequency range, the fault frequency range set at approximately 80% of the second frequency and greater.

20. The packaged integrated circuit of claim 17, wherein the oscillator circuit generates the oscillator signal having the second frequency when coupled to the dummy bond pad.

\* \* \* \* \*